(12) United States Patent
Choi et al.

(10) Patent No.: US 11,925,080 B2
(45) Date of Patent: Mar. 5, 2024

(54) DISPLAY DEVICE

(71) Applicant: Samsung Display Co., LTD., Yongin-si (KR)

(72) Inventors: Jae-Ho Choi, Seoul (KR); Won Kyu Kwak, Seongnam-si (KR); Chang Soo Pyon, Seongnam-si (KR); Seung Gyu Tae, Osan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 401 days.

(21) Appl. No.: 17/380,221

(22) Filed: Jul. 20, 2021

(65) Prior Publication Data

US 2022/0140055 A1     May 5, 2022

(30) Foreign Application Priority Data

Nov. 4, 2020 (KR) .......................... 10-2020-0146269

(51) Int. Cl.
| | | |
|---|---|---|
| *H01L 21/00* | (2006.01) | |
| *G09G 3/3291* | (2016.01) | |
| *H10K 59/121* | (2023.01) | |
| *H10K 59/131* | (2023.01) | |

(52) U.S. Cl.
CPC ......... *H10K 59/131* (2023.02); *G09G 3/3291* (2013.01); *H10K 59/121* (2023.02)

(58) Field of Classification Search
CPC .................................................. H10K 59/131
See application file for complete search history.

(56) References Cited

U.S. PATENT DOCUMENTS

2021/0305347 A1* 9/2021 Jeon .................... H10K 50/8426
2021/0376037 A1* 12/2021 You .................... H10K 59/1315

FOREIGN PATENT DOCUMENTS

| KR | 1020140133053 | 11/2014 |
|---|---|---|
| KR | 1020160043614 | 4/2016 |
| KR | 1020180049005 | 5/2018 |
| KR | 1020190009457 | 1/2019 |
| KR | 1020200074728 | 6/2020 |

* cited by examiner

*Primary Examiner* — Douglas M Menz
(74) *Attorney, Agent, or Firm* — CANTOR COLBURN LLP

(57) ABSTRACT

A display device includes a substrate including a display area and a non-display area, a plurality of pixels disposed in the display area, a common voltage supply wiring overlapping the non-display area and disposed on the substrate, a driving voltage supply wiring overlapping the non-display area and disposed on the substrate, and a data voltage supply wiring overlapping the non-display area and electrically connected to the plurality of pixels, where at least one of the common voltage supply wiring and the driving voltage supply wiring includes a chamfered area, the data voltage supply wiring includes a first data voltage supply wiring, a second data voltage supply wiring, and a third data voltage supply wiring, and the first to third data voltage supply wirings are disposed in different layers.

20 Claims, 17 Drawing Sheets

DISPLAY DEVICE

This application claims priority to Korean Patent Application No. 10-2020-0146269 filed on Nov. 4, 2020, and all the benefits accruing therefrom under 35 U.S.C. § 119, the content of which in its entirety is herein incorporated by reference.

BACKGROUND

(a) Field

Embodiments of the invention relate to a display device.

(b) Description of the Related Art

A display device is a device that visually displays data. Such a display device includes a substrate partitioned into a display area and a non-display area. In the display area, a scan line and a data line are insulated from each other, and a plurality of pixels is included. In addition, in the display area, a thin film transistor ("TFT") corresponding to each of the pixels and a pixel electrode electrically connected to the TFT are disposed. In the display area, an opposed electrode commonly provided to the pixels may be disposed. In the non-display area, various wirings, scan drivers, data drivers, controllers, etc., that transmit electrical signals to the display area may be provided.

Such display devices have various uses. Accordingly, a design of the peripheral area of the display device is diversifying.

SUMMARY

Embodiments are to provide a display device improved with reliability.

A display device in an embodiment includes a substrate including a display area and a non-display area, a plurality of pixels disposed in the display area, common voltage supply wiring overlapping the non-display area and disposed on the substrate, driving voltage supply wiring overlapping the non-display area and disposed on the substrate, and data voltage supply wiring overlapping the non-display area and electrically connected to the plurality of pixels, where at least one of the common voltage supply wiring and the driving voltage supply wiring includes a chamfered area, the data voltage supply wiring includes first data voltage supply wiring, second data voltage supply wiring, and third data voltage supply wiring, and the first to third data voltage supply wirings are disposed in different layers.

In an embodiment, the data voltage supply wiring may extend in a direction different from a main extension direction of the common voltage supply wiring and a main extension direction of the driving voltage supply wiring, and the data voltage supply wiring may be separated from the chamfered area.

In an embodiment, the chamfered area may include a first straight line extending in the first direction, a second straight line extending in a second direction perpendicular to the first direction, and a third straight line inclined in a third direction between the first direction and the second direction, and an extension direction of the data voltage supply wiring and an extension direction of the third straight line may be parallel.

In an embodiment, the display device may further include a first insulating layer disposed on the substrate, a first conductive layer disposed on the first insulating layer, a second insulating layer disposed on the first conductive layer, a second conductive layer disposed on the second insulating layer, a third insulating layer disposed on the second conductive layer, a third conductive layer disposed on the third insulating layer, a fourth insulating layer disposed on the third conductive layer, and a fourth conductive layer disposed on the fourth insulating layer.

In an embodiment, the fourth insulating layer may include an opening area overlapping a part of the driving voltage supply wiring and the common voltage supply wiring, and the chamfered area may overlap the opening area.

In an embodiment, the first data voltage supply wiring may be disposed in a same layer as the first conductive layer, the second data voltage supply wiring may be disposed in a same layer as the second conductive layer, and the third data voltage supply wiring may be disposed in a same layer as the third conductive layer.

In an embodiment, the driving voltage supply wiring and the common voltage supply wiring may be disposed in a same layer as the fourth conductive layer.

In an embodiment, the third data voltage supply wiring may overlap either one of the driving voltage supply wiring and the common voltage supply wiring in the opening area.

In an embodiment, the display device may further include fine wiring extending along an edge of the third data voltage supply wiring.

In an embodiment, the display device may further include a metal layer disposed between the driving voltage supply wiring and the common voltage supply wiring, and the metal layer may include an oblique side facing the chamfered area.

In an embodiment, the metal layer may be separated from the driving voltage supply wiring and the common voltage supply wiring.

In an embodiment, the metal layer may overlap the opening area.

In an embodiment, the display device may include at least one of a first metal layer corresponding to the chamfered area of the common voltage supply wiring and a second metal layer corresponding to the chamfered area of the driving voltage supply wiring.

In an embodiment, the metal layer may overlap the third data voltage supply wiring.

A display device in an embodiment includes a substrate including a display area and a non-display area, a plurality of pixels disposed in the display area, common voltage supply wiring overlapping the non-display area and disposed on the substrate, driving voltage supply wiring overlapping the non-display area and disposed on the substrate, data voltage supply wiring overlapping the non-display area and electrically connected to the plurality of pixels, and an insulating layer disposed between the data voltage supply wiring and the driving voltage supply wiring, and between the data voltage supply wiring and the common voltage supply wiring, where the insulating layer includes an opening area exposing at least part of the driving voltage supply wiring and the common voltage supply wiring, and the data voltage supply wiring in the opening area overlaps and is insulated from the driving voltage supply wiring and the common voltage supply wiring.

In an embodiment, the data voltage supply wiring may be plural, and a plurality of data voltage supply wirings may include first data voltage supply wiring, second data voltage supply wiring, and third data voltage supply wiring disposed in different layers.

In an embodiment, at least one of the driving voltage supply wiring and the common voltage supply wiring may include a chamfered area overlapping the opening area.

In an embodiment, the data voltage supply wiring may extend in a direction different from a main extension direction of the common voltage supply wiring and a main extension direction of the driving voltage supply wiring, and the chamfered area may include a side parallel to the direction in which the data voltage supply wiring extends.

In an embodiment, a metal layer of an island shape disposed between the driving voltage supply wiring and the common voltage supply wiring may be further included.

In an embodiment, the metal layer may include an oblique side facing the side of the chamfered area.

In an embodiment, it is possible to provide a display device with improved reliability by preventing a short-circuit between wirings disposed in different layers in the non-display area.

BRIEF DESCRIPTION OF THE DRAWINGS

The above and other embodiments, advantages and features of this disclosure will become more apparent by describing in further detail embodiments thereof with reference to the accompanying drawings, in which.

DETAILED DESCRIPTION

Figure 1:
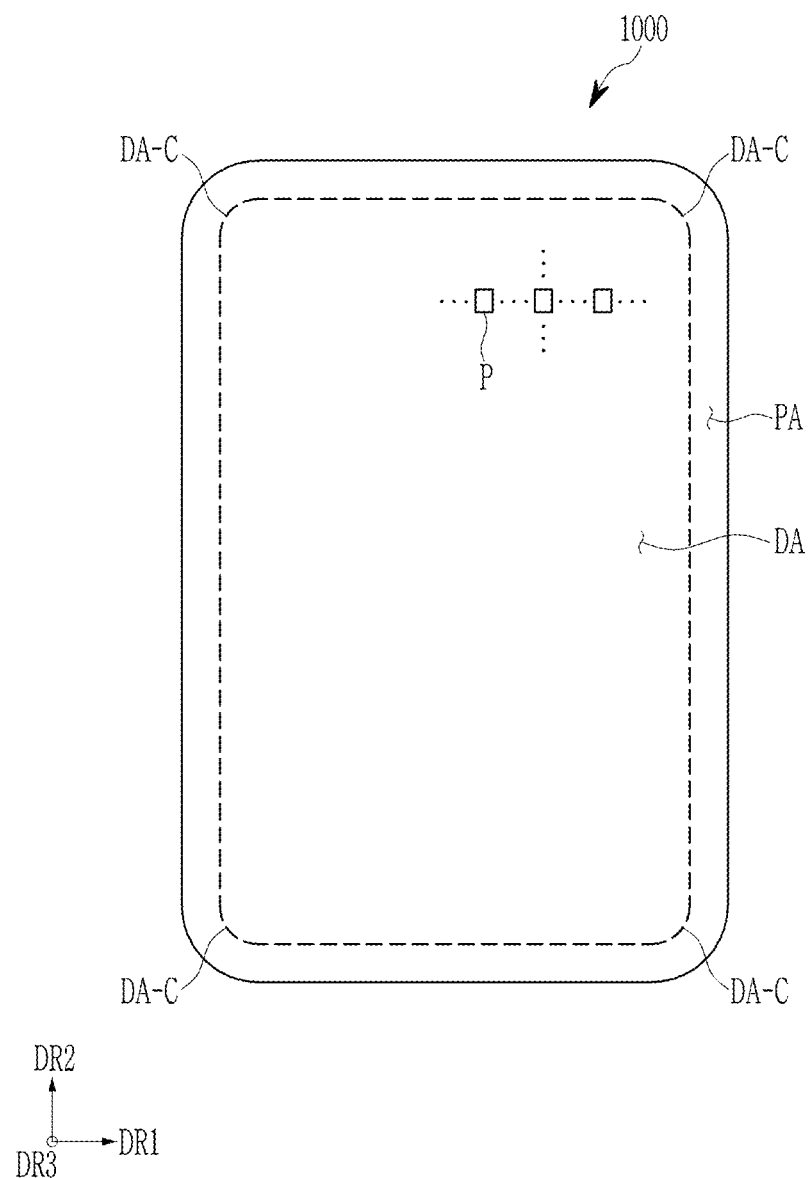
FIG. 1 is a schematic top plan view of a display device.

Embodiments of the invention will be described more fully hereinafter with reference to the accompanying drawings, in which embodiments of the invention are shown. As those skilled in the art would realize, the described embodiments may be modified in various different ways, all without departing from the spirit or scope of the invention.

Parts that are irrelevant to the description will be omitted to clearly describe the invention, and the same elements will be designated by the same reference numerals throughout the specification.

In addition, the size and thickness of each configuration shown in the drawings are arbitrarily shown for understanding and ease of description, but the invention is not limited thereto. In the drawings, the thickness of layers, films, panels, areas, etc., are exaggerated for clarity. In the drawings, for better understanding and ease of description, the thickness of some layers and areas is exaggerated.

It will be understood that when an element such as a layer, film, area, or substrate is also referred to as being "on" another element, it may be directly on the other element or intervening elements may also be present. In contrast, when an element is also referred to as being "directly on" another element, there are no intervening elements present. Further, in the specification, the word "on" or "above" means disposed on or below the object portion, and does not necessarily mean disposed on the upper side of the object portion based on a gravitational direction.

In addition, unless explicitly described to the contrary, the word "comprise", and variations such as "comprises" or "comprising", will be understood to imply the inclusion of stated elements but not the exclusion of any other elements.

Further, throughout the specification, the phrase "in a plan view" means viewing a target portion from the top, and the phrase "in a cross-section" means viewing a cross-section provided by vertically cutting a target portion from the side.

Figure 2:
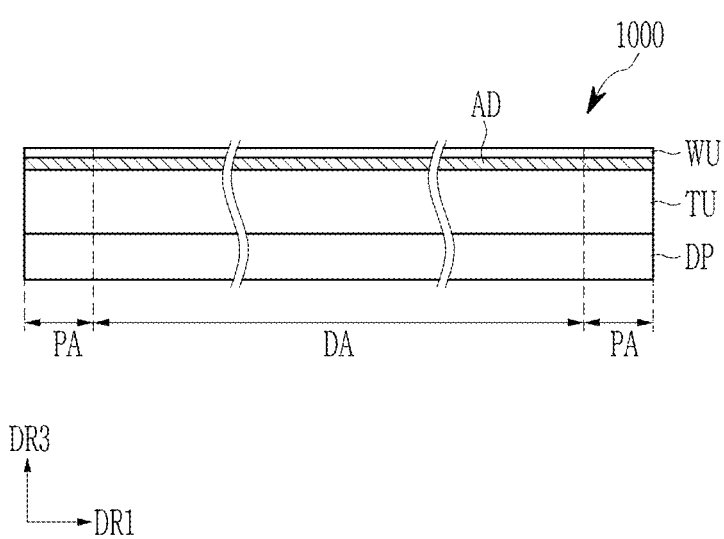
FIG. 2 is a schematic cross-sectional view of a display device of FIG. 1.
Figure 3:
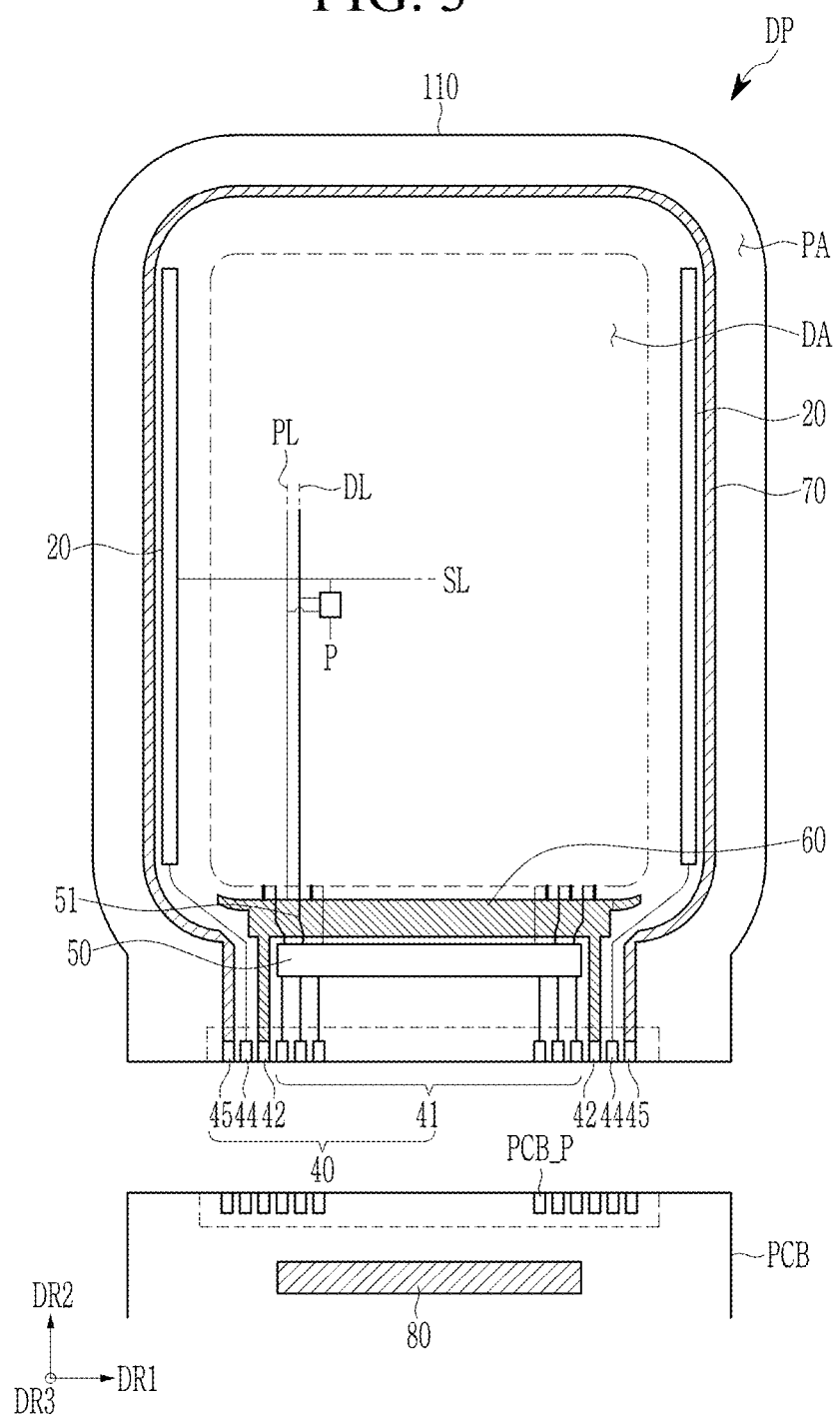
FIG. 3 is a top plan view of a display panel.

Now, a display device in an embodiment is described with reference to FIG. 1 to FIG. 3. FIG. 1 is a schematic top plan view of a display device, FIG. 2 is a schematic cross-sectional view of a display device of FIG. 1, and FIG. 3 is a top plan view of a display panel.

Referring to FIG. 1, a display device 1000 in an embodiment includes a display area DA in which a plurality of pixels P is disposed and an image is displayed, and a non-display area PA adjacent to the display area DA. The non-display area PA is an area in which an image is not displayed.

The display area DA may have a quadrangular (e.g., rectangular) shape, for example. Each corner DA-C of the display area DA may have a rounded shape. The non-display area PA may have a shape surrounding the display area DA. However, the invention is not limited thereto, and the shapes of the display area DA and the non-display area PA may be relatively designed.

One surface on which the image is displayed in the display device 1000 is parallel to a plane defined by the first direction DR1 and the second direction DR2. A third direction DR3 indicates a normal direction of the surface on which the image is displayed, that is, a thickness direction of the display device 1000. The front (or top) and rear (or bottom) sides of each member are defined by the third direction DR3. However, the directions indicated by the first to third directions DR1, DR2, and DR3 are relative concepts and may be converted into other directions.

Referring to FIG. 1 and FIG. 2 described above, the display device 1000 may include a display panel DP, a touch unit TU disposed on the display panel DP, and a cover window WU disposed on the touch unit TU.

The display panel DP may be a flat rigid display panel, but is not limited thereto, and may be a flexible display panel. The display panel in an embodiment of the invention may be a light emitting display panel, and is not particularly limited thereto. In an embodiment, the display panel may be an organic light emitting display panel or a quantum dot light emitting display panel, for example. The emission layer of the organic light emitting panel may include an organic light emitting material. The emission layer of the quantum dot light emitting display panel may include a quantum dot and a quantum rod. Hereinafter, the display panel is described as an organic light emitting panel.

The touch unit TU may be disposed on the display panel DP for a touchscreen function of the display device 1000. The touch unit TU may include a touch electrode of various patterns, and may be a resistive type or a capacitance type.

The cover window WU is disposed on the display panel DP and the touch unit TU. The cover window WU protects the display panel DP and the touch unit TU. The cover window WU may define the appearance of the display device.

An adhesive layer AD may be disposed between the touch unit TU and the cover window WU. Although not shown in this specification, it may further include an adhesive layer (not shown) disposed between the display panel DP and the touch unit TU.

Referring to FIG. 3, the display panel DP includes a substrate 110 including a display area DA and a non-display area PA corresponding to the display area DA and the non-display area PA of the display device 1000 described in FIG. 1. The non-display area PA may be defined along the border of the display area DA.

The display panel DP includes a plurality of pixels P. A plurality of pixels P may be disposed in the display area DA on the substrate 110. Each pixel P includes a light-emitting element and a driving circuit unit connected thereto. Each pixel P emits, for example, red, green, and blue or white light, and may include, for example, an organic light emitting diode.

The display panel DP may include a plurality of signal lines and a pad unit. The plurality of signal lines may include a scan line SL extending in the first direction DR1, and a data line DL and a driving voltage line PL extending in the second direction DR2.

A scan driver 20 generates and transmits a scan signal to each pixel P through the scan line SL. In an embodiment, the scan driver 20 may be disposed on the left and right sides of the display area DA. The illustrated embodiment shows a structure in which the scan driver 20 is disposed on both sides of the substrate 110, but in another embodiment, the scan driver may be disposed only on one side of the substrate 110.

The pad unit 40 is disposed on one end of the display panel DP and includes a plurality of terminals 41, 42, 44, and 45. The pad unit 40 is exposed without being covered by an insulating layer and may be electrically connected to the printed circuit board ("PCB"). The pad unit 40 may be electrically connected to the pad unit PCB P of the PCB. The PCB may transmit a signal or power of an integrated circuit ("IC") driving chip 80 to the pad unit 40.

The controller converts a plurality of image signals transmitted from the outside into a plurality of image data signals and transmits the converted signals to the data driver 50 through the terminal 41. In addition, the controller may receive a vertical synchronization signal, a horizontal synchronizing signal, and a clock signal, generates a control signal for controlling the driving of the scan driver 20 and the data driver 50, and transmits the control signal to each through the terminals 44 and 41. The controller transmits a driving voltage ELVDD to the driving voltage supply wiring 60 through the terminal 42. In addition, the controller transmits a common voltage ELVSS to each common voltage supply wiring 70 through the terminal 45.

The data driver 50 is disposed in the non-display area PA, and generates and transmits a data signal to each pixel P through the data voltage supply wiring 51. The data driver 50 may be disposed on one side of the display panel DP and may be disposed between the pad unit 40 and the display area DA, for example.

The driving voltage supply wiring 60 is disposed in the non-display area PA. In an embodiment, the driving voltage supply wiring 60 may be disposed between the data driver 50 and the display area DA, for example. The driving voltage supply wiring 60 provides the driving voltage ELVDD to the pixels P. The driving voltage supply wiring 60 may extend in the first direction DR1 and may be connected to a plurality of driving voltage lines PL extending in the second direction DR2.

The common voltage supply wiring 70 is disposed in the non-display area PA. The common voltage supply wiring 70 may have a shape surrounding the substrate 110. The common voltage supply wiring 70 transmits the common voltage ELVSS to one electrode (e.g., a common electrode) of the light-emitting element included in the pixel P.

Figure 4:
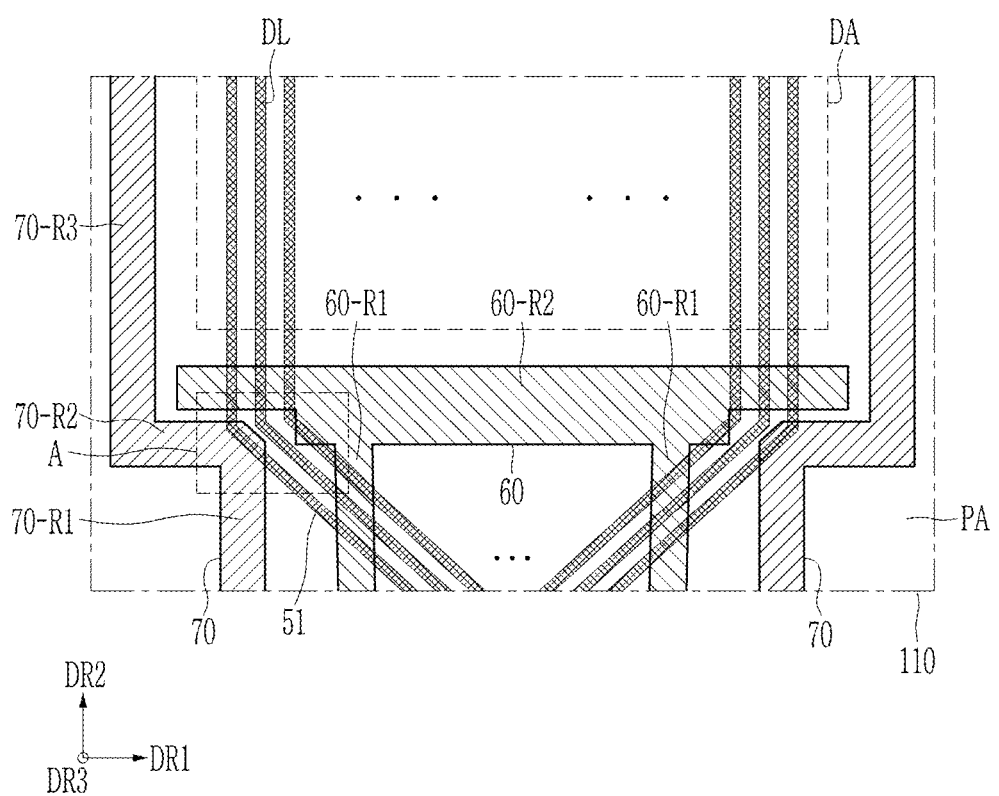
FIG. 4 is an enlarged top plan view of a part of a display panel.
Figure 5:
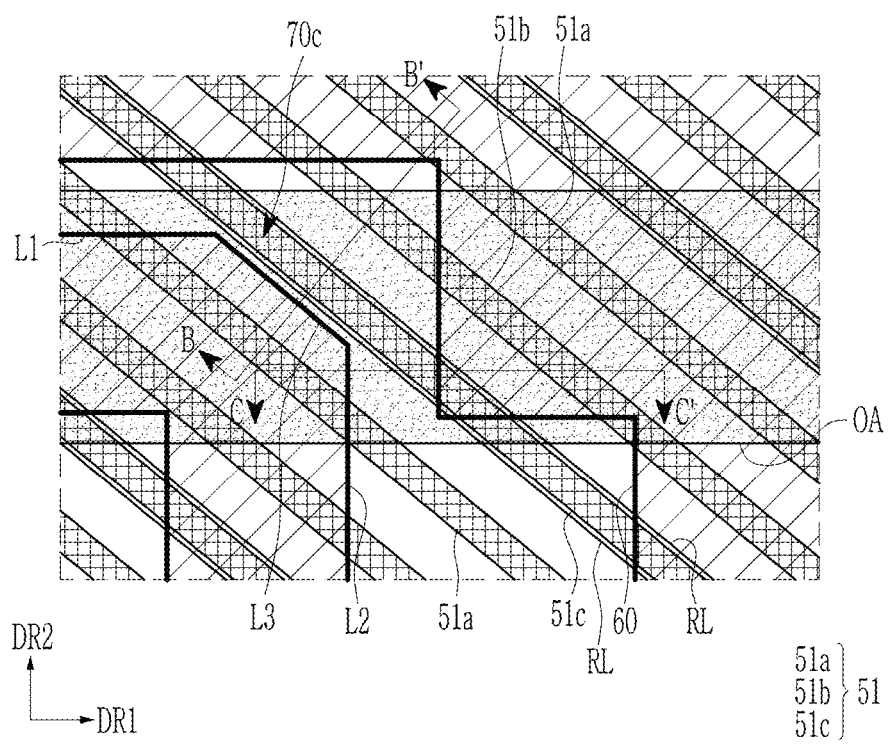
FIG. 5 is an enlarged top plan view of an embodiment of a part A of FIG. 4.
Figure 6:
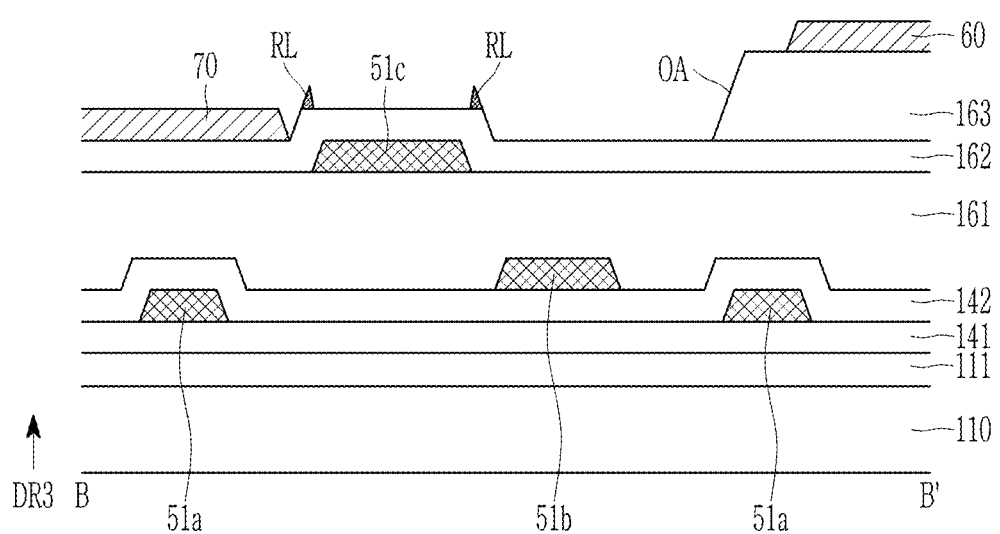
FIG. 6 is a cross-sectional view taken along line A-A' of FIG. 5.

Hereinafter, a driving voltage supply wiring, a common voltage supply wiring, and a data voltage supply wiring disposed in the non-display area in an embodiment are described in detail with reference to FIG. 4 and FIG. 6. FIG. 4 is an enlarged top plan view of a part of a display panel, FIG. 5 is an enlarged top plan view of an embodiment of a part A of FIG. 4, and FIG. 6 is a cross-sectional view taken along line A-A' of FIG. 5.

FIG. 4 is a view schematically showing an embodiment of only the common voltage supply wiring 70, the driving voltage supply wiring 60, and the data voltage supply wiring 51 disposed on the substrate 110 overlapping the non-display area PA.

Referring to FIG. 4, the common voltage supply wiring 70 may include a first area 70-R1 extending along the second direction DR2 from the pad unit, a second area 70-R2 bent along the first direction DR1 from the first area 70-R1, and a third area 70-R3 connected to the second area 70-R2 and extending along the second direction DR2.

The driving voltage supply wiring 60 may include a first area 60-R1 extending along the second direction DR2 from the pad unit and a second area 60-R2 extending along the first direction DR1.

The data voltage supply wiring 51 may be extended along a diagonal direction inclined to the first direction DR1 and the second direction DR2. The data voltage supply wiring 51 may extend along the second direction DR2 in a portion adjacent to the display area DA and may be electrically connected to the data line DL disposed in the display area DA.

One corner of the second area 60-R2 of the driving voltage supply wiring 60 in an embodiment and one corner connecting the first area 70-R1 and the second area 70-R2 of the common voltage supply wiring 70 may be disposed adjacent to each other.

Next, the data voltage supply wiring 51 indicated by A in FIG. 4 and disposed between one corner of the second area 60-R2 of the driving voltage supply wiring 60 and one corner connecting the first area 70-R1 and the second area 70-R2 of the common voltage supply wiring 70 is described with reference to FIG. 5.

Referring to FIG. 5 along with FIG. 4, the common voltage supply wiring 70 includes a connection area connecting the first area 70-R1 and the second area 70-R2. The connection area in an embodiment may be a chamfered area 70c. The common voltage supply wiring 70 may include the chamfered area 70c. The chamfered area 70c may include a first straight line L1 extending in the first direction DR1, a second straight line L2 extending in the second direction DR2, and a third straight line L3 connecting the first straight line L1 and the second straight line L2 and extending in the diagonal direction. The chamfered area 70c in an embodiment is illustrated in an angled shape, but may have a substantially smooth border.

The chamfered area 70c may be disposed adjacent to the driving voltage supply wiring 60. The chamfered area 70c may be disposed adjacent to one corner included in the second area 60-R2 of the driving voltage supply wiring 60.

The data voltage supply wiring 51 may be extended along a diagonal direction inclined in the first direction DR1 and the second direction DR2. In an embodiment, the data voltage supply wiring 51 may extend along substantially the same direction as the third straight line L3 included in the chamfered area 70c. The data voltage supply wiring 51 may be parallel to the third straight line L3 included in the chamfered area 70c.

The data voltage supply wiring 51 may include first data voltage supply wiring 51a, second data voltage supply wiring 51b, and third data voltage supply wiring 51c, which are disposed in different layers. In the illustrated embodiment, the first data voltage supply wiring 51a, the second data voltage supply wiring 51b, and the third data voltage supply wiring 51c are spaced apart in a plan view, however since they are disposed on the different layers, they may be overlapped with each other.

In an embodiment, a fine wiring RL extending along the edge of the third data voltage supply wiring 51c may be disposed.

Figure 7:
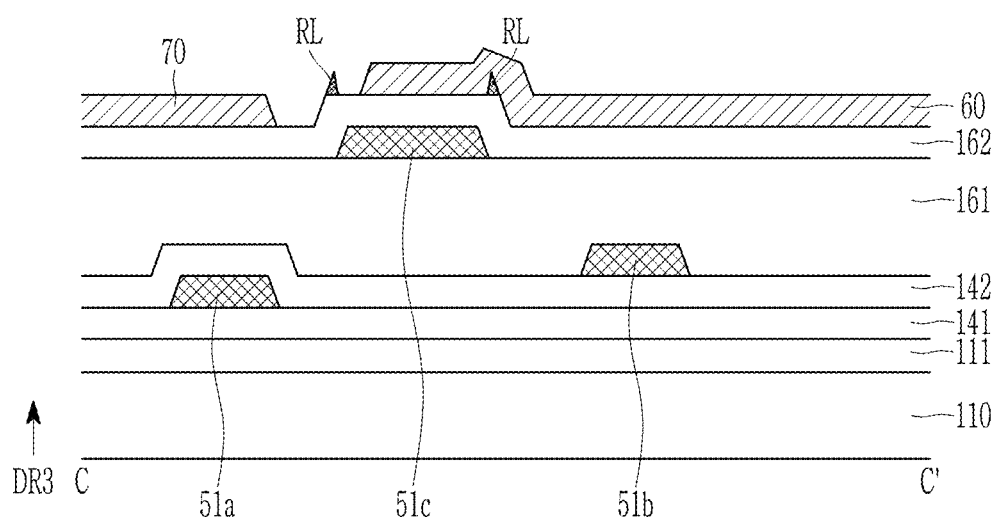
FIG. 7 is a cross-sectional view taken along line B-B' of FIG. 5.

Referring to the stacking order with reference to FIG. 6 and FIG. 7, the first data voltage supply wiring 51a is disposed on a buffer layer 111 and a first gate insulating layer 141 disposed on the substrate 110. The second gate insulating layer 142 is disposed on the first data voltage supply wiring 51a. The second data voltage supply wiring 51b is disposed on the second gate insulating layer 142. A first insulating layer 161 is disposed on the second data voltage supply wiring 51b. The third data voltage supply wiring 51c is disposed on the first insulating layer 161. A second insulating layer 162 is disposed on the third data voltage supply wiring 51c. The fine wiring RL, the common voltage supply wiring 70, and the driving voltage supply wiring 60 may be disposed on the second insulating layer 162.

In an embodiment, a third insulating layer 163 may be disposed on the second insulating layer 162. An opening area OA exposing a portion of the driving voltage supply wiring 60 and the common voltage supply wiring 70 may be defined in the third insulating layer 163. In the opening area OA, the driving voltage supply wiring 60 and the common voltage supply wiring 70 may be disposed on the second insulating layer 162. FIG. 6 shows the configuration that the common voltage supply wiring 70 overlaps the opening area OA and is disposed on the second insulating layer 162.

The opening area OA may expose the chamfered area 70c included in the common voltage supply wiring 70. Also, the opening area OA may expose one corner included in the driving voltage supply wiring 60.

The fine wiring RL may be disposed on the second insulating layer 162. The fine wiring RL may be extended along the edge of the third data voltage supply wiring 51c. The illustrated embodiment shows the form in which the fine wiring RL is continuously provided along the third data voltage supply wiring 51c, but is not limited thereto, and it may be provided discontinuously along at least some edges of the third data voltage supply wiring 51c.

In the process of forming the common voltage supply wiring 70 and the driving voltage supply wiring 60 on the second insulating layer 162 and the third insulating layer 163, the second insulating layer 162 has a step difference due to the third data voltage supply wiring 51c. At this time, a part of the conductive layer for forming the common voltage supply wiring 70 and the driving voltage supply wiring 60 may remain around the third data voltage supply wiring 51c due to the step difference. The remaining conductive layer may be disposed along the edge of the third data voltage supply wiring 51c, and thereby the aforementioned fine wiring RL may be provided.

The third data voltage supply wiring 51c and the fine wiring RL may be spaced apart from the chamfered area 70c in a plan view. The third data voltage supply wiring 51c and the fine wiring RL may not overlap the chamfered area 70c.

The third data voltage supply wiring 51c and the fine wiring RL may overlap any one of the common voltage supply wiring 70 and the driving voltage supply wiring 60 in the opening area OA. The third data voltage supply wiring 51c and the fine wiring RL may only overlap the common voltage supply wiring 70 or only the driving voltage supply wiring 60 in the opening area OA.

The fine wiring RL provided along the edge of the third data voltage supply wiring 51c is disposed in the same layer as the common voltage supply wiring 70 and the driving voltage supply wiring 60. When the third data voltage supply wiring 51c overlaps both of the common voltage supply wiring 70 and the driving voltage supply wiring 60 in the opening area OA, and the fine wiring RL also overlaps both of the common voltage supply wiring 70 and the driving voltage supply wiring 60. At this time, the fine wiring RL may be electrically connected to the common voltage supply wiring 70 and the driving voltage supply wiring 60, thereby causing short circuit defects. However, in an embodiment, the common voltage supply wiring 70 includes the chamfered area 70c, so that it does not overlap the third data voltage supply wiring Mc and the fine wiring RL provided therefrom. The third data voltage supply wiring Mc and the fine wiring RL overlap only one of the common voltage supply wiring 70 and the driving voltage supply wiring 60, and the common voltage supply wiring 70 and the driving voltage supply wiring 60 may be prevented from being shorted.

Next, the non-display area in an embodiment is described with reference to FIG. 8 to FIG. 12. FIG. 8, FIG. 9, FIG. 10, FIG. 11, and FIG. 12 are enlarged top plan views of a part A of FIG. 4. A description of the same constituent element as the above-described constituent element is omitted.

Figure 8:
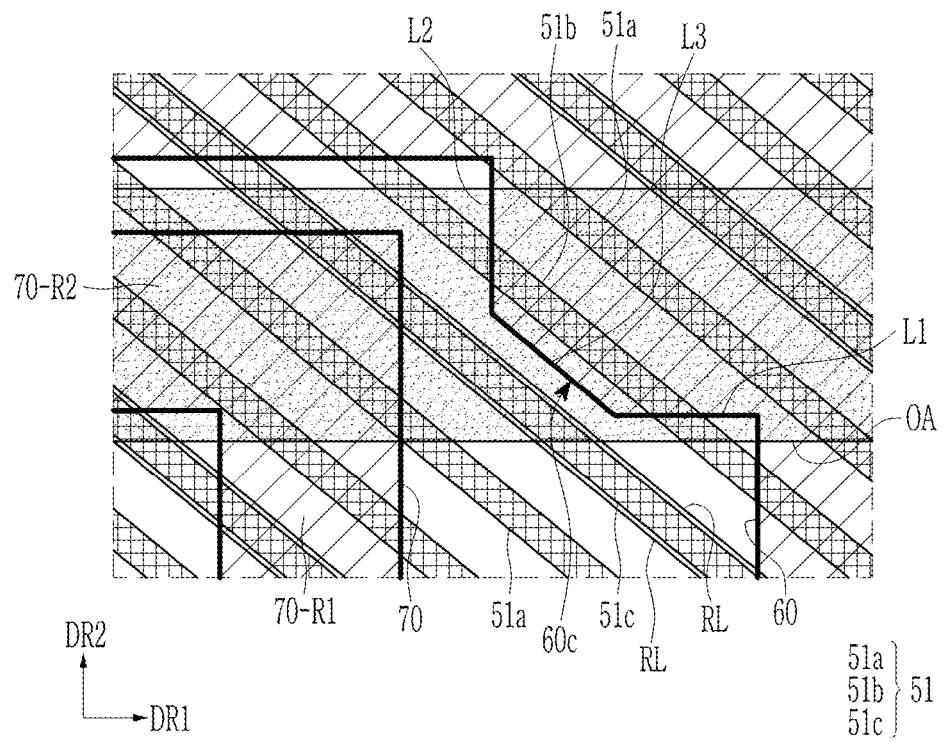
FIG. 8, FIG. 9, FIG. 10, FIG. 11, and FIG. 12 are enlarged top plan views of an embodiment of a part A of FIG. 4.

First, referring to FIG. 8 along with FIG. 4, the driving voltage supply wiring 60 may include a chamfered area 60c. The chamfered area 60c may include a first straight line L1 extending in the first direction DR1, a second straight line L2 extending in the second direction DR2, and a third straight line L3 connecting the first straight line L1 and the second straight line L2 and extending in the diagonal direction. The chamfered area 60c in an embodiment is illustrated in an angled shape, but may have a substantially smooth border.

The chamfered area 60c may be disposed adjacent to the common voltage supply wiring 70. The chamfered area 60c may be disposed adjacent to one corner where the first area 70-R1 and the second area 70-R2 of the common voltage supply wiring 70 are connected.

The data voltage supply wiring 51 and the fine wiring RL may be extended along the diagonal direction oblique with respect to the first direction DR1 and the second direction DR2. In an embodiment, the data voltage supply wiring 51 may extend along substantially the same direction as the third straight line L3 included in the chamfered area 60c. The data voltage supply wiring 51 may be parallel to the third straight line L3 included in the chamfered area 60c.

The data voltage supply wiring 51 may include first data voltage supply wiring 51a, second data voltage supply wiring 51b, and third data voltage supply wiring 51c, which are disposed in different layers.

The opening area OA may expose the chamfered area 60c, which is included in the driving voltage supply wiring 60. In addition, the opening area OA may expose one corner of the common voltage supply wiring 70.

The third data voltage supply wiring 51c and the fine wiring RL may be spaced apart from the chamfered area 60c in a plan view. The third data voltage supply wiring 51c and the fine wiring RL may not overlap the chamfered area 60c.

The third data voltage supply wiring 51c and the fine wiring RL may overlap one of the common voltage supply wiring 70 and the driving voltage supply wiring 60 in the opening area OA. The third data voltage supply wiring 51c and the fine wiring RL may only overlap the common voltage supply wiring 70 or only the driving voltage supply wiring 60 in the opening area OA.

The fine wiring RL provided along the edge of the third data voltage supply wiring 51c is disposed in the same layer as the common voltage supply wiring 70 and the driving voltage supply wiring 60. When the third data voltage supply wiring 51c overlaps both the common voltage supply wiring 70 and the driving voltage supply wiring 60 in the opening area OA, the fine wiring RL also overlaps both the common voltage supply wiring 70 and the driving voltage supply wiring 60. At this time, the fine wiring RL may cause short circuit defects by being electrically connected to the common voltage supply wiring 70 and the driving voltage supply wiring 60. However, in an embodiment, the driving voltage supply wiring 60 includes the chamfered area 60c, so that it does not overlap the third data voltage supply wiring 51c and the fine wiring RL provided therefrom. The third data voltage supply wiring 51c and the fine wiring RL overlap only one of the common voltage supply wiring 70 and the driving voltage supply wiring 60, so the common voltage supply wiring 70 and the driving voltage supply wiring 60 maybe prevented from being shorted.

Figure 9:
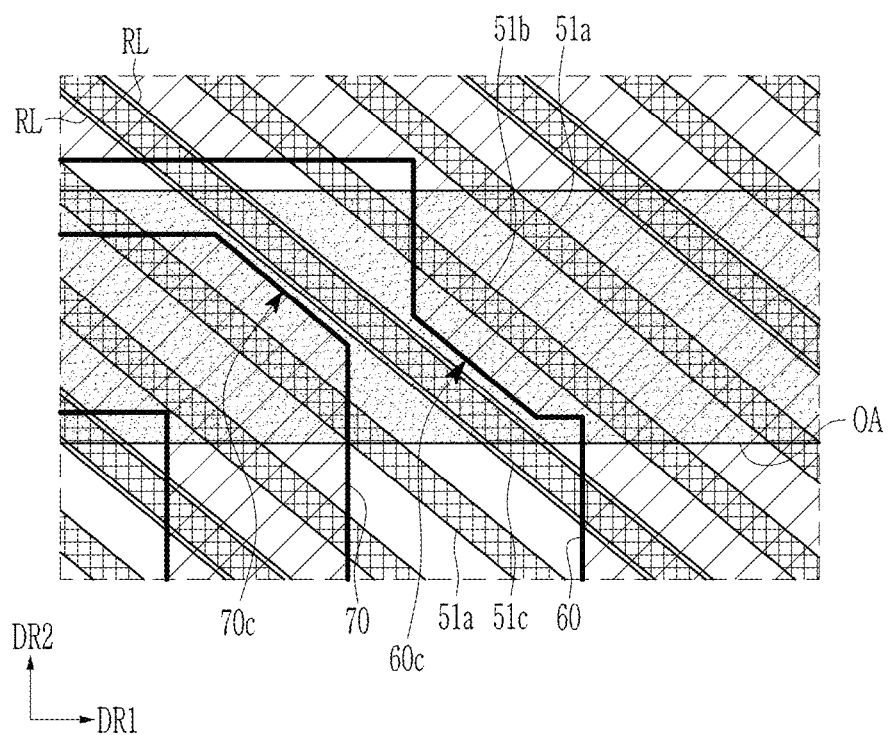

Next, referring to FIG. 9, the common voltage supply wiring 70 in an embodiment may include the chamfered area 70c as shown in FIG. 5, and the driving voltage supply wiring 60 may include the chamfered area 60c as shown in FIG. 8.

Figure 10:
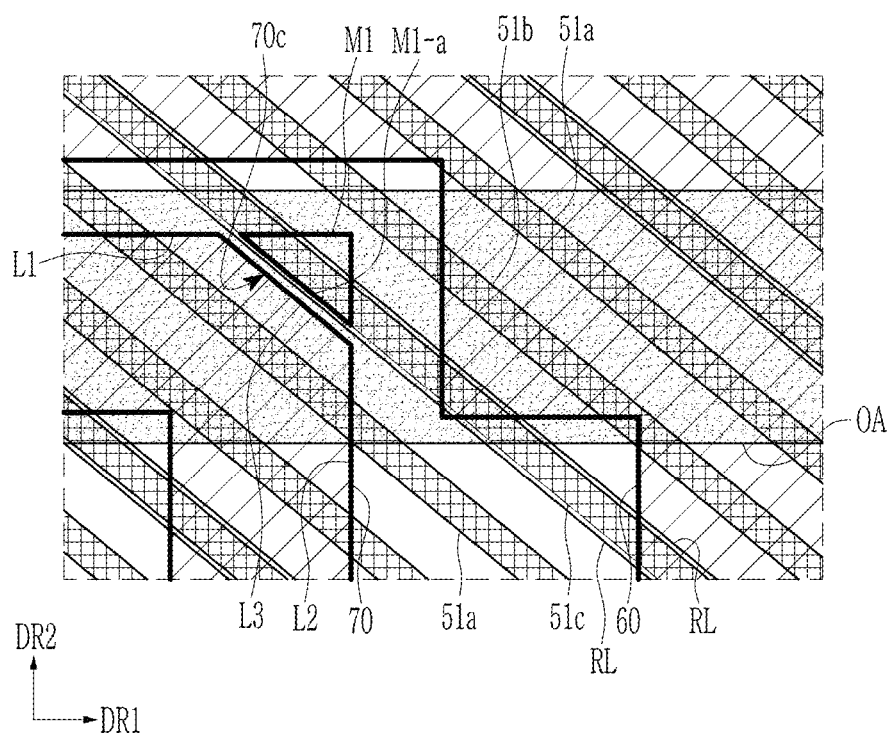

Next, referring to FIG. 10, the display device in an embodiment may further include a first metal layer M1 adjacent to the common voltage supply wiring 70. The first metal layer M1 may be separated from the common voltage supply wiring 70 in a plan view. The first metal layer M1 may overlap the opening area OA. The first metal layer M1 may be in the form as an island.

The first metal layer M1 is disposed adjacent to the chamfered area 70c of the common voltage supply wiring 70. Specifically, the first metal layer M1 may have a right triangle shape including a chamfered side M1-a parallel to the third straight line L3 included in the chamfered area 70c. However, the first metal layer in an embodiment is not limited to the above-described form, and of course, any form separated from the common voltage supply wiring is possible.

The first metal layer M1 may be disposed in the same layer as the common voltage supply wiring 70. The first metal layer M1 may include the same material as that of the common voltage supply wiring 70 and may be provided in the same process.

The first metal layer M1 may overlap the third data voltage supply wiring 51c and the fine wiring RL. Referring to FIG. 10, the third data voltage supply wiring 51c and the fine wiring RL overlapping the first metal layer M1 may also overlap the driving voltage supply wiring 60 overlapping the opening area OA while extending in the diagonal direction.

However, since a separate voltage is not applied to the first metal layer M1, short circuit defects do not occur even when being connected to the driving voltage supply wiring 60 by the third data voltage supply wiring 51c and the fine wiring RL.

Figure 11:
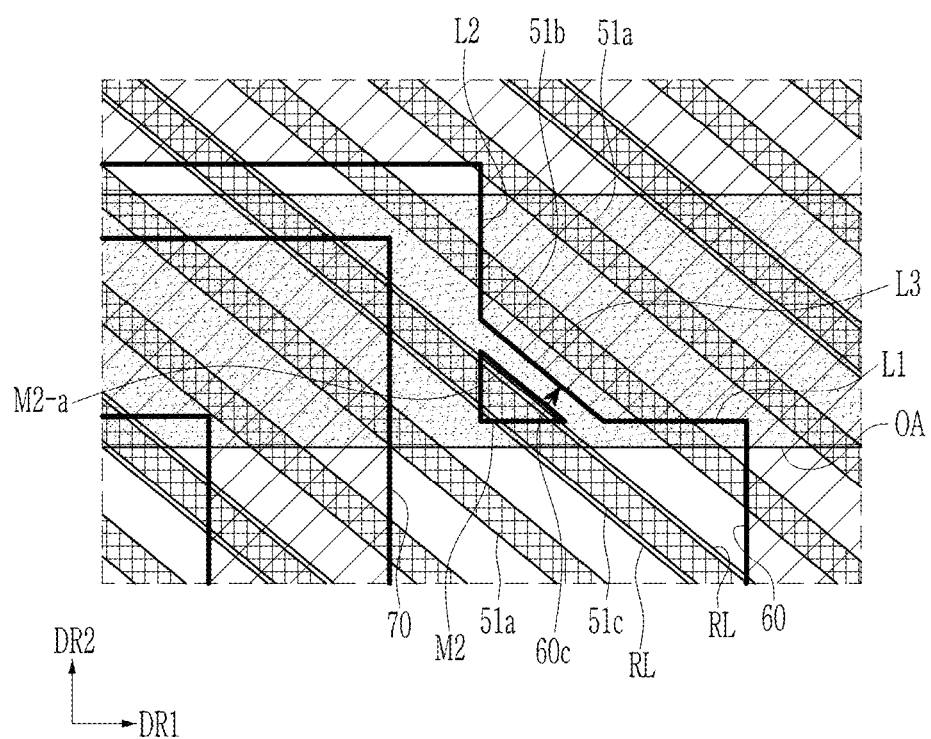

Next, referring to FIG. 11, the display device in an embodiment may further include a second metal layer M2 disposed adjacent to the common voltage supply wiring 60. The second metal layer M2 may be spaced from the driving voltage supply wiring 60 in a plan view. The second metal layer M2 may overlap the opening area OA. The second metal layer M2 may be in the form of an island.

The second metal layer M2 is disposed adjacent to the chamfered area 60c of the driving voltage supply wiring 60. In particular, the second metal layer M2 may have a right triangle shape including an oblique side M2-a parallel to the third straight line L3 included in the chamfered area 60c. However, the second metal layer in an embodiment is not limited to the above-described form, and of course, any form separated from the driving voltage supply wiring is possible.

The second metal layer M2 may be disposed in the same layer as the driving voltage supply wiring 60. The second metal layer M2 may include the same material as that of the driving voltage supply wiring 60 and may be provided in the same process.

The second metal layer M2 may overlap the third data voltage supply wiring 51c and the fine wiring RL. Referring to FIG. 11, the third data voltage supply wiring 51c and the fine wiring RL overlapping the second metal layer M2 may also overlap the common voltage supply wiring 70 overlapping the opening area OA while extending in the diagonal direction. However, since a separate voltage is not applied to the second metal layer M2, short circuit defects do not occur even when being connected to the common voltage supply wiring 70 by the third data voltage supply wiring 51c and the fine wiring RL.

Figure 12:
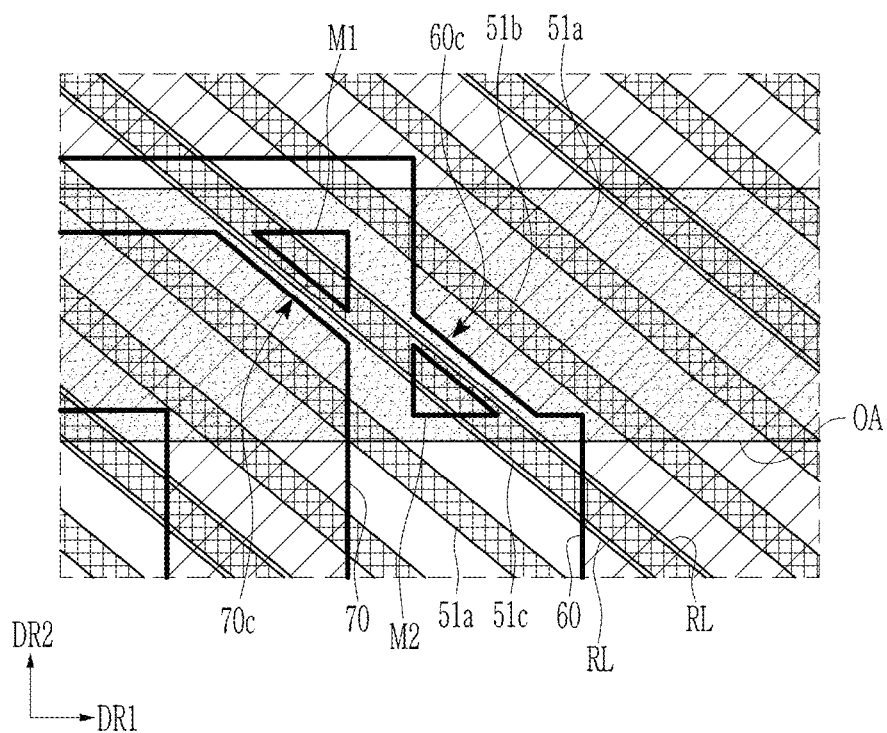

Next, referring to FIG. 12, the display device in an embodiment may include the first metal layer M1 described in FIG. 10 and the second metal layer M2 described in FIG. 11.

Figure 13:
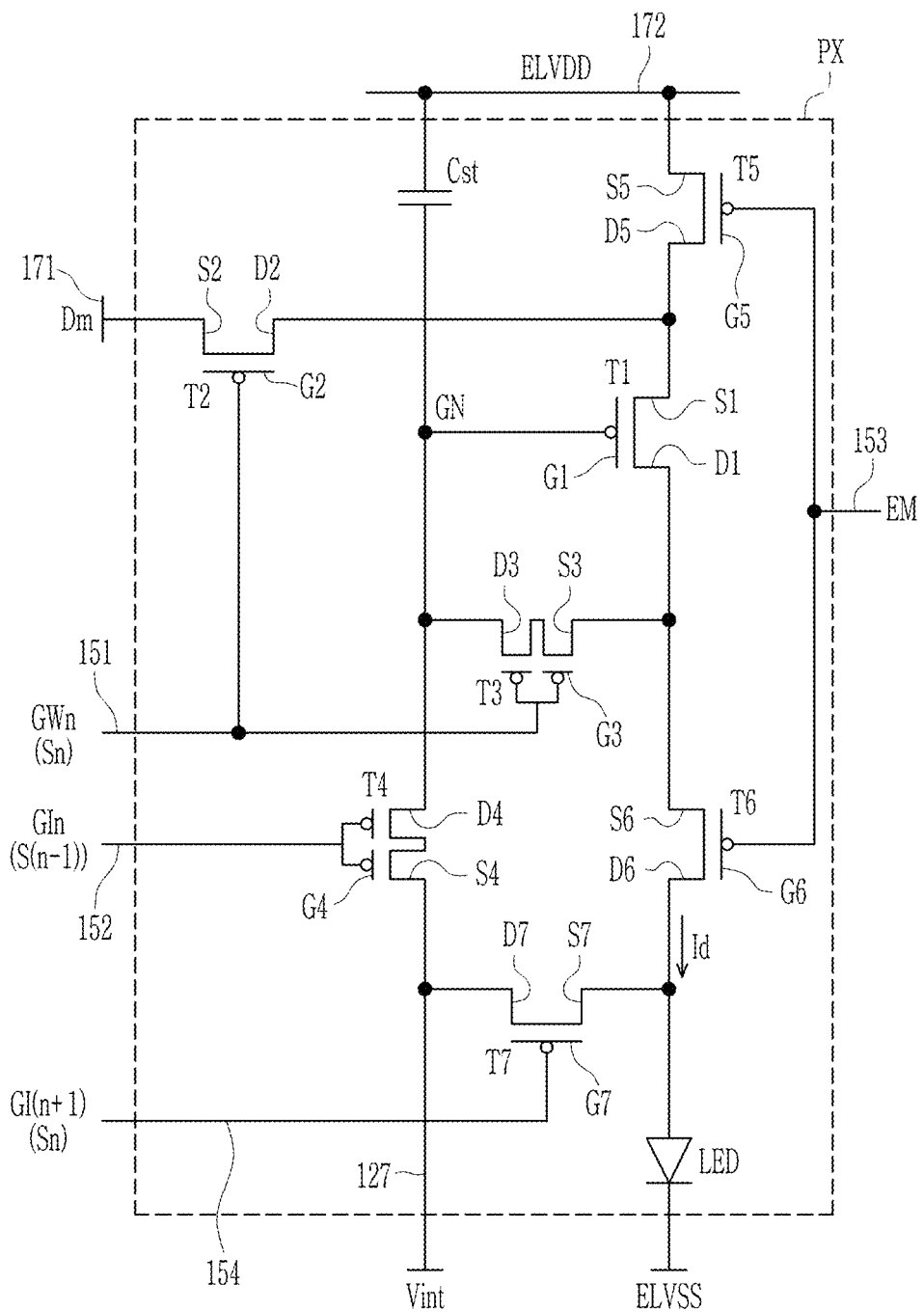
FIG. 13 is a circuit diagram of an embodiment of one pixel of a display area.
Figure 14:
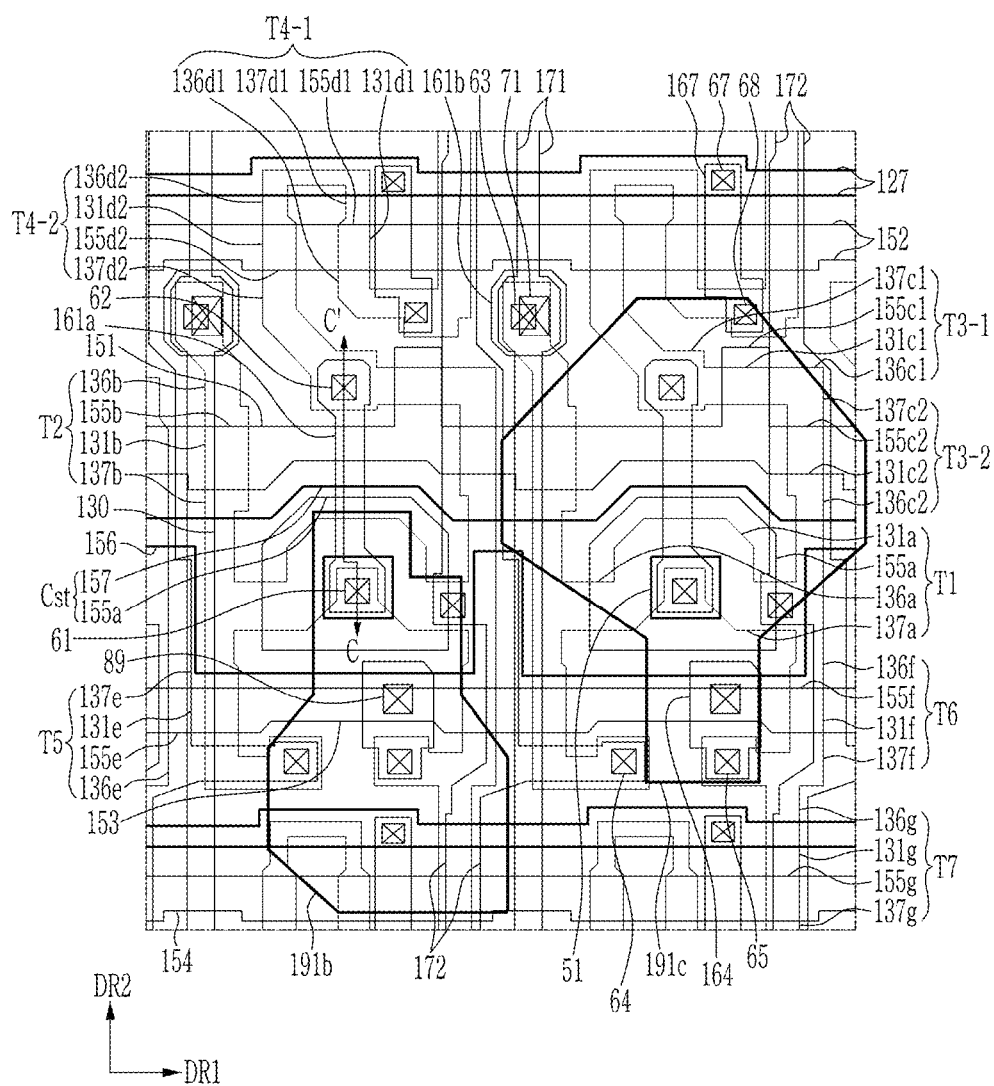
FIG. 14 is a plan view of an embodiment of one pixel of a display area.
Figure 15:
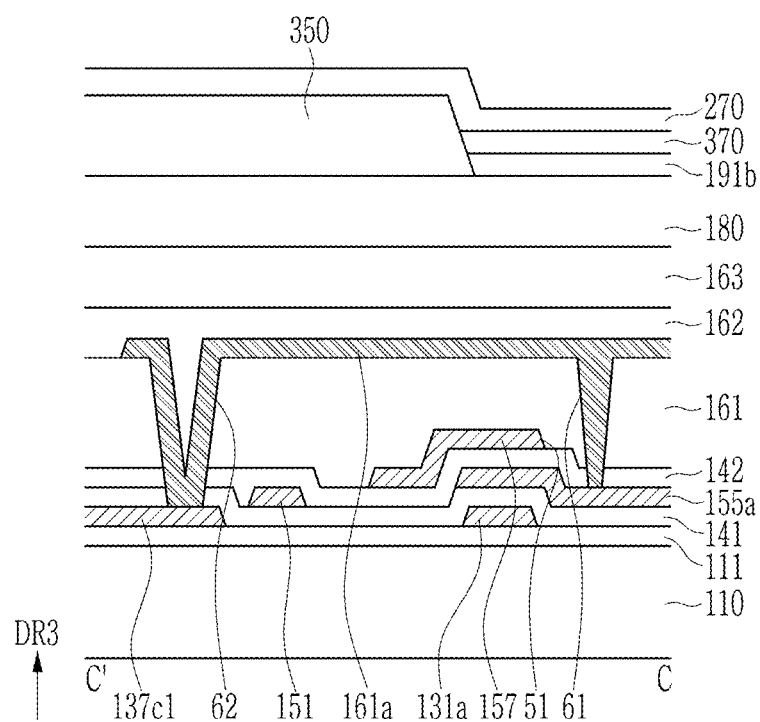
FIG. 15 is a cross-sectional view taken along line C-C' of FIG. 14.

Next, one pixel of the display area is described with reference to FIG. 13 to FIG. 15. FIG. 13 is a circuit diagram of one pixel of a display area in an embodiment, FIG. 14 is a plan view of one pixel of a display area in an embodiment, and FIG. 15 is a cross-sectional view taken along line C-C' of FIG. 14. For reference, one pixel described in the embodiment includes a driving circuit unit and a light emitting diode LED connected to the driving circuit unit, and the driving circuit unit may include a plurality of transistors including an active layer and a conductor.

Referring to FIG. 13, the display device in an embodiment includes a plurality of pixels PX capable of displaying an image and a plurality of signal lines 127, 151, 152, 153, 154, 171, and 172. One pixel PX may include a plurality of transistors T1, T2, T3, T4, T5, T6, and T7 connected to a plurality of signal lines 127, 151, 152, 153, 154, 171, and 172, a capacitor Cst, and at least one light emitting diode LED. In the illustrated embodiment, one pixel PX including one light emitting diode LED is mainly described.

The signal lines 127, 151, 152, 153, 154, 171, and 172 may include an initialization voltage line 127, a plurality of scan lines 151, 152, and 154, a control line 153, a data line 171, and a driving voltage line 172.

The initialization voltage line 127 may transmit an initialization voltage Vint. A plurality of scan lines 151, 152, and 154 may respectively transmit scan signals GWn, GIn, and GI(n+1), where n is a natural number.

The scan signals GWn, GIn, and GI(n+1) may transmit a gate-on voltage and a gate-off voltage capable of turning-on/turning-off the transistors T2, T3, T4, and T7 included in the pixel PX.

The scan lines 151, 152, and 154 connected to one pixel PX may include a first scan line 151 capable of transmitting a scan signal GWn, a second scan line 152 capable of transmitting a scan signal GIn having a gate-on voltage at different timing from the first scan line 151, and a third scan line 154 capable of transmitting a scan signal GI(n+1).

The control line 153 may transmit a control signal, particularly a light emission control signal EM capable of controlling the light emission of the light emitting diode LED included in the pixel PX. The control signal transmitted by the control line 153 may transmit the gate-on voltage and the gate-off voltage and may have a different waveform from the scan signal transmitted by the scan lines 151, 152, and 154.

The data line 171 may transmit a data signal Dm, and the driving voltage line 172 may transmit a driving voltage ELVDD. The data signal Dm may have a different voltage level according to the image signal input to the display device, and the driving voltage ELVDD may have a substantially constant level.

A plurality of transistors T1, T2, T3, T4, T5, T6, and T7 included in one pixel PX may include a first transistor T1, a second transistor T2, a third transistor T3, a fourth transistor T4, a fifth transistor T5, a sixth transistor T6, and a seventh transistor T7.

The first scan line 151 may transmit the scan signal GWn to the second transistor T2 and the third transistor T3, the second scan line 152 may transmit the scan signal GIn to the fourth transistor T4, the third scan line 154 may transmit the scan signal GI(n+1) to the seventh transistor T7, and the control line 153 may transmit the light emission control signal EM to the fifth transistor T5 and the sixth transistor T6. The gate electrode G1 of the first transistor T1 is connected to one terminal of the capacitor Cst through the driving gate node GN, the first electrode S1 of the first transistor T1 is connected to the driving voltage line 172 via the fifth transistor T5, and the second electrode D1 of the first transistor T1 is connected to the anode of the light emitting diode LED via the sixth transistor T6. The first transistor T1 may receive the data signal Dm transmitted from the data line 171 according to the switching operation of the second transistor T2 and supply the driving current Id to the light emitting diode LED.

The gate electrode G2 of the second transistor T2 is connected to the first scan line 151, the first electrode S2 of the second transistor T2 is connected to the data line 171, and the second electrode D2 of the second transistor T2 is connected to the driving voltage line 172 via the fifth transistor T5 while being connected to the first electrode Si of the first transistor T1. The second transistor T2 may be turned on according to the scan signal GWn transmitted through the first scan line 151 and transmit the data signal Dm transmitted from the data line 171 to the first electrode Si of the first transistor T1.

The gate electrode G3 of the third transistor T3 is connected to the first scan line 151, and the first electrode S3 of the third transistor T3 is connected to the anode of the light emitting diode LED via the sixth transistor T6 while being connected to the second electrode D1 of the first transistor T1. The second electrode D3 of the third transistor T3 is connected to the second electrode D4 of the fourth transistor T4, one terminal of the capacitor Cst, and the gate electrode G1 of the first transistor T1. The third transistor T3 is turned on according to the scan signal GWn transmitted through the first scan line 151 and connects the gate electrode G1 and the second electrode D1 of the first transistor T1 to each other, thereby diode-connecting the first transistor T1.

The gate electrode G4 of the fourth transistor T4 is connected to the second scan line 152, the first electrode S4 of the fourth transistor T4 is connected to the initialization voltage terminal transmitting an initialization voltage Vint, and the second electrode D4 of the fourth transistor T4 is connected to one terminal of the capacitor Cst and the gate electrode G1 of the first transistor T1 through the second electrode D3 of the third transistor T3. The fourth transistor T4 is turned on according to the scan signal GIn received through the second scan line 152 to transmit the initialization voltage Vint to the gate electrode G1 of the first transistor T1, thereby performing a role of initializing the voltage of the gate electrode G1 of the first transistor T1.

The gate electrode G5 of the fifth transistor T5 is connected to the control line 153, the first electrode S5 of the fifth transistor T5 is connected to the driving voltage line 172, and the second electrode D5 of the fifth transistor T5 is connected to the first electrode S1 of the first transistor T1 and the second electrode D2 of the second transistor T2.

The gate electrode G6 of the sixth transistor T6 is connected to the control line 153, the first electrode S6 of the sixth transistor T6 is connected to the second electrode D1 of the first transistor T1 and the first electrode S3 of the third transistor T3, and the second electrode D6 of the sixth transistor T6 is electrically connected to the anode of the light emitting diode LED. The fifth transistor T5 and the sixth transistor T6 are simultaneously turned on according to the light emission control signal EM transmitted through the control line 153, and accordingly the driving voltage ELVDD may be compensated through the diode-connected first transistor T1 and transmitted to the light emitting diode LED.

The gate electrode G7 of the seventh transistor T7 is connected to the third scan line 154, the first electrode S7 of the seventh transistor T7 is connected to the second electrode D6 of the sixth transistor T6 and the anode of the light emitting diode LED, and the second electrode D7 of the seventh transistor T7 is connected to the initialization voltage terminal transmitting the initialization voltage Vint and the first electrode S4 of the fourth transistor T4. The transistors T1, T2, T3, T4, T5, T6, and T7 may be P-type channel transistors such as a p-channel metal-oxide-semiconductor ("PMOS"), but are not limited thereto, and at least one among the transistors T1, T2, T3, T4, T5, T6, and T7 may be an N-type channel transistor and may include both a P-type and an N-type channel transistor.

One terminal of the capacitor Cst is connected to the gate electrode G1 of the first transistor T1 as described above and the other terminal is connected to the driving voltage line 172. The cathode of the light emitting diode LED is connected to the common voltage terminal that transmits the common voltage ELVSS, so that the common voltage ELVSS may be applied.

The structure of the pixel PX in an embodiment is not limited to the structure shown in FIG. 13, and the number of transistors and the number of capacitors included in one pixel PX and the connection relationship may be variously modified.

Next, the arrangement of one pixel having the above-described circuit diagram is described with reference to FIG. 14 and FIG. 15.

The display device in an embodiment may include a plurality of transistors T1, T2, T3, T4, T5, T6, and T7 and a capacitor Cst which are connected to a plurality of scan lines 151, 152, and 154, a control line 153, a data line 171, and a driving voltage line 172. The pixel shown in FIG. 14 may be repeated in the first direction DR1 and the second direction DR2.

A plurality of scan lines 151, 152, and 154 and the control line 153 may extend substantially in the same direction (e.g., the first direction DR1) in a plan view. The data line 171 and the driving voltage line 172 generally extend in the second direction DR2 in a plan view and may intersect a plurality of scan lines 151, 152, and 154 and the control line 153. The data line 171 may transmit the data signal Dm, and the driving voltage line 172 may transmit the driving voltage ELVDD. The data line 171 and the driving voltage line 172 may be disposed in different layers.

The display device may further include a storage line 156 and an initialization voltage line 127.

The storage line 156 may extend in the first direction DR1, which is a generally horizontal direction in a plan view. The storage line 156 may include an extension part 157 disposed at each pixel. The storage line 156 may transmit the driving voltage ELVDD. An opening 51 may be defined approximately in the center of the extension part 157.

The initialization voltage line 127 transmits the initialization voltage Vint while being generally extended in the first direction DR1, and one initialization voltage line 127 may be disposed between the storage lines 156 adjacent in the second direction DR2. The initialization voltage line 127 may be disposed adjacent to the fourth transistor T4.

A plurality of scan lines 151, 152, and 154, the control line 153, and the driving gate electrode 155a are included in a first conductive layer (151, 152, 153, 154, and 155a), thereby being disposed in the same layer in a cross-section and including the same material as each other. The first data voltage supply wiring 51a in an embodiment may be disposed in the same layer as the first conductive layer (151, 152, 153, 154, and 155a).

The storage lines 156 and 157 and the initialization voltage line 127 are included in a second conductive layer (127, 156, and 157) as a different layer from the first conductive layer (151, 152, 153, 154, and 155a), thereby they may be disposed in the same layer in a cross-section and include the same material as each other. The second conductive layer (127, 156, and 157) may be disposed on the layers above the first conductive layer (151, 152, 153, 154, and 155a). The second data voltage supply wiring 51b in an embodiment may be disposed in the same layer as the second conductive layer (127, 156, and 157).

The driving voltage line 172 and the connecting members 161a, 161b, 164, and 167 are included in the third conductive layer (161a, 161b, 164, 167, and 172), which is a different layer from the first and second conductive layers, thereby they may be disposed in the same layer in a cross-section and include the same material. The third conductive layer (161a, 161b, 164, 167, and 172) may be disposed in the layer above the second conductive layer (127, 156, and 157). The third data voltage supply wiring 51c in an embodiment may be disposed in the same layer as the third conductive layer (161a, 161b, 164, 167, and 172).

The data line 171 is included in the fourth conductive layer (171), which is a different layer from the first to third conductive layers. The fourth conductive layer (171) may be disposed in a layer above the third conductive layer (161a, 161b, 164, 167, and 172). The common voltage supply wiring 70, the driving voltage supply wiring 60, and the fine wiring RL in an embodiment may be disposed in the same layer as the fourth conductive layer (171).

Each channel of a plurality of transistors T1, T2, T3, T4, T5, T6, and T7 may be provided in one semiconductor layer 130. The semiconductor layer 130 may include a semiconductor material such as an amorphous/polysilicon or an oxide semiconductor. The semiconductor layer 130 includes a plurality of channel areas and a plurality of conductive areas, which are semiconductors. The channel area includes channel areas 131a, 131b, 131c1, 131c2, 131d1, 131d2, 131e, 131f, and 131g forming each channel of the transistors T1, T2, T3, T4, T5, T6, and T7. The remaining portions of the semiconductor layer 130 excluding the channel areas 131a, 131b, 131c1, 131c2, 131d1, 131d2, 131e, 131f, and 131g may be conductive areas. The conductive area has a higher carrier concentration than that of the channel areas 131a, 131b, 131c1, 131c2, 131d1, 131d2, 131e, 131f, and 131g. A pair of conductive areas disposed on both sides of the channel areas 131a, 131b, 131c1, 131c2, 131d1, 131d2, 131e, 131f, and 131g may be a first electrode area and a second electrode area of the corresponding transistors T1, T2, T3, T4, T5, T6, and T7.

The first transistor T1 includes the channel area 131a, the first electrode area 136a and the second electrode area 137a disposed on both sides of the channel area 131a, and the driving gate electrode 155a overlapping the channel area 131a in a plan view.

The driving gate electrode 155a may be included in the first conductive layer (151, 152, 153, 154, and 155a) described earlier, and as shown in FIG. 15, may be connected to the first connecting member 161a through a contact hole 61. The contact hole 61 is defined in the opening 51 of the extension part 157 of the storage line 156.

The second transistor T2 includes the channel area 131b, the first electrode area 136b and the second electrode area 137b disposed on both sides of the channel area 131b, and the gate electrode 155b overlapping the channel area 131b in a plan view. The gate electrode 155b is a part of the first scan line 151. The first electrode area 136b is connected to the second connecting member 161b through the contact hole 63, and the second electrode area 137b is connected to the first electrode area 136a of the first transistor T1. Since the second connecting member 161b is connected to the data line 171 through the contact hole 71, the first electrode area 136b is eventually electrically connected to data line 171, thereby receiving the data signal Dm.

The third transistor T3 may include a third transistor first part T3-1 and a third transistor second part T3-2 that are adjacent to each other and connected to each other.

The third transistor first part T3-1 includes a channel area 131c1 overlapping the first scan line 151 in a plan view, a first electrode area 136c1 and a second electrode area 137c1 disposed on both sides of the channel area 131c1, and a gate electrode 155c1 overlapping the channel area 131c1. The gate electrode 155c1 may be a part of the protruded portion of the first scan line 151. The second electrode area 137c1 is connected to the first connecting member 161a through a contact hole 62.

The third transistor second part T3-2 includes a channel area 131c2 overlapping the first scan line 151 in a plan view, a first electrode area 136c2 and a second electrode area 137c2 disposed on both sides of the channel area 131c2, and a gate electrode 155c2 overlapping the channel area 131c2. The gate electrode 155c2 is a part of the first scan line 151. The first electrode area 136c2 of the third transistor second part T3-2 is connected to the second electrode area 137a of the first transistor T1, and the second electrode area 137c2 is connected to the first electrode area 136c1 of the third transistor first part T3-1.

The fourth transistor T4 may include a fourth transistor first part T4-1 and a fourth transistor second part T4-2 that are adjacent to each other and connected to each other. The fourth transistor first part T4-1 includes a channel area 131d1 that overlaps the second scan line 152 in a plan view, a first electrode area 136d1 and a second electrode area 137d1 disposed on both sides of the channel area 131d1, and a gate electrode 155d1 overlapping the channel area 131d1. The gate electrode 155d1 is a part of the second scan line 152. The first electrode area 136d1 may be connected to the initialization voltage line 127 through the contact holes 67 and 68, and the second electrode area 137d1 may be connected to the first electrode area 136d2 of the fourth transistor second part T4-2.

The fourth transistor second part T4-2 includes a channel area 131d2 overlapping the second scan line 152 in a plan view, a first electrode area 136d2 and a second electrode area 137d2 disposed on both sides of the channel area 131d2, and a gate electrode 155d2 overlapping the channel area 131d2. The gate electrode 155d2 is a part of the second scan line 152.

The fifth transistor T5 includes a channel area 131e, a first electrode area 136e and a second electrode area 137e disposed on both sides of the channel area 131e, and a gate electrode 155e overlapping the channel area 131e. The gate electrode 155e is a part of the control line 153. The first electrode area 136e is connected to the driving voltage line 172 through the contact hole 64, and the second electrode area 137e is connected to the first electrode area 136a of the first transistor T1. The first electrode area 136e is electrically connected to the driving voltage line 172 to receive the driving voltage ELVDD.

The sixth transistor T6 includes a channel area 131f, a first electrode area 136f and a second electrode area 137f disposed on both sides of the channel area 131f, and a gate electrode 155f overlapping the channel area 131f. The gate electrode 155f is a part of the control line 153. The first electrode area 136f is connected to the second electrode area 137a of the first transistor T1, and the second electrode area 137f is connected to the fourth connecting member 164 through the contact hole 65.

The seventh transistor T7 includes a channel area 131g, a first electrode area 136g and a second electrode area 137g disposed on both sides of the channel area 131g, and a gate electrode 155g overlapping the channel area 131g. The gate electrode 155g is a part of the third scan line 154. The first electrode area 136g is connected to the second electrode area 137f of the sixth transistor T6, and the second electrode area 137g is connected to the initialization voltage line 127 through the contact hole 68, so that the initialization voltage Vint may be applied.

The capacitor Cst may maintain the voltage of the driving gate electrode 155a. The capacitor Cst includes the driving gate electrode 155a and the extension part 157 of the storage line 156 overlapping each other in a plan view as two terminals. The extension part 157 of the storage line 156 may have a larger area in a plan view than the driving gate electrode 155a, and may cover the entire area of the driving gate electrode 155a.

Next, the stacked structure of the above-described constituent elements is briefly described with reference to FIG. 14 and FIG. 15. Referring to FIG. 14 and FIG. 15, the display device in the embodiment may include a substrate 110. The substrate 110 may include an inorganic insulating material such as glass, or an organic insulating material of a plastic such as a polyimide ("PI"). The substrate 110 may have various degrees of flexibility.

A buffer layer 111 may be disposed on the substrate 110. The buffer layer 111 blocks impurities from being transmitted from the substrate 110 to an overlying layer of the buffer layer 111, particularly the semiconductor layer 130, thereby preventing a characteristic degradation of the semiconductor layer 130 and reducing stress. The buffer layer 111 may include an inorganic insulating material or an organic insulating material such as a silicon nitride or a silicon oxide. Some or all of the buffer layer 111 may be omitted.

The semiconductor layer 130 described in FIG. 14 is disposed on the buffer layer 111, and the first gate insulating layer 141 is disposed on the semiconductor layer 130. The first gate insulating layer 141 may include an inorganic insulating material or an organic insulating material such as a silicon nitride or a silicon oxide.

The first conductive layer (151, 152, 153, 154, and 155a) including a plurality of scan lines 151, 152, and 154, the control line 153, and the driving gate electrode 155a described in FIG. 14 may be disposed on the first gate insulating layer 141.

The second gate insulating layer 142 is disposed on the first conductive layer (151, 152, 153, 154, and 155a) and the first gate insulating layer 141. The second gate insulating layer 142 may include an inorganic insulating material or an organic insulating material such as a silicon nitride and a silicon oxide.

The second conductive layer (127, 156, and 157) including the storage line 156 and the initialization voltage line 127 described in FIG. 14 may be disposed on the second gate insulating layer 142.

The first insulating layer 161 may be disposed on the second conductive layer (127, 156, and 157) and the second gate insulating layer 142. The first insulating layer 161 may include an inorganic insulating material or an organic insulating material such as silicon nitride or silicon oxide.

The third conductive layer (161a, 161b, 164, 167, and 172) including the first connecting member 161a, the second connecting member 161b, the third connecting member 164, the fourth connecting member 167, and the driving voltage line 172 transmitting the driving voltage ELVDD and mainly extending in the second direction DR2 in a plan view described in FIG. 14 is disposed on the first insulating layer 161.

The second insulating layer 162 and the third insulating layer 163 may be disposed on the third conductive layer (161a, 161b, 164, 167, and 172) and the first insulating layer 161. Each of the second insulating layer 162 and the third insulating layer 163 may independently include an inorganic insulating material and/or an organic insulating material such as a silicon nitride and a silicon oxide.

As shown in FIG. 14, the fourth conductive layer (171) including the data line 171 may be disposed on the third insulating layer 163.

The fourth insulating layer 180 is disposed on the fourth conductive layer (171) and the third insulating layer 163. The fourth insulating layer 180 may include an organic insulating material such as a polyacryl-based resin or a polyimide-based resin. The upper surface of the fourth insulating layer 180 may be substantially flat.

The fifth conductive layer including a plurality of pixels electrodes 191b and 191c may be disposed on the fourth insulating layer 180. The pixel electrodes 191b and 191c may be connected to the connecting member 164 through the contact hole 89. The partition wall 350 may be disposed on the fourth insulating layer 180 and the pixel electrodes 191b and 191c. Openings above each pixel electrode 191b and 191c are defined in the partition wall 350. The emission layer 370 is disposed on the pixel electrodes 191b and 191c. The emission layer 370 may be disposed within the opening of the partition wall 350. The emission layer 370 may include an organic light emission material or an inorganic light emission material. The common electrode 270 is disposed on the emission layer 370. The common electrode 270 is also disposed on the partition wall 350 and may be extended over a plurality of pixels. The pixel electrodes 191b and 191c, the emission layer 370, and the common electrode 270 together form the light emitting diode LED. An encapsulation layer (not shown) protecting the light emitting diode LED may be further disposed on the common electrode 270. The encapsulation layer may include an inorganic layer and an organic layer that are alternately stacked, only an inorganic layer, or only an organic layer.

Figure 16:
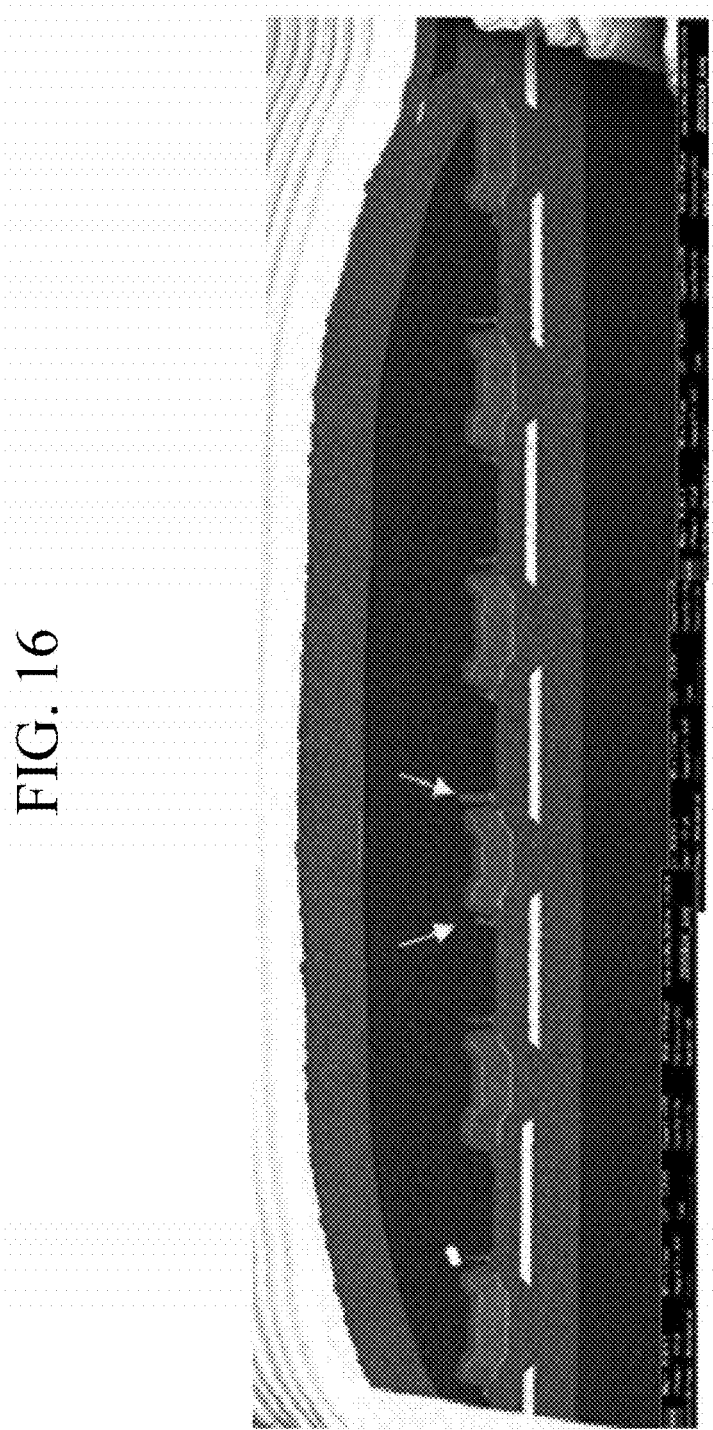
FIG. 16 is a cross-section image of a display device according to a comparative example.
Figure 17:
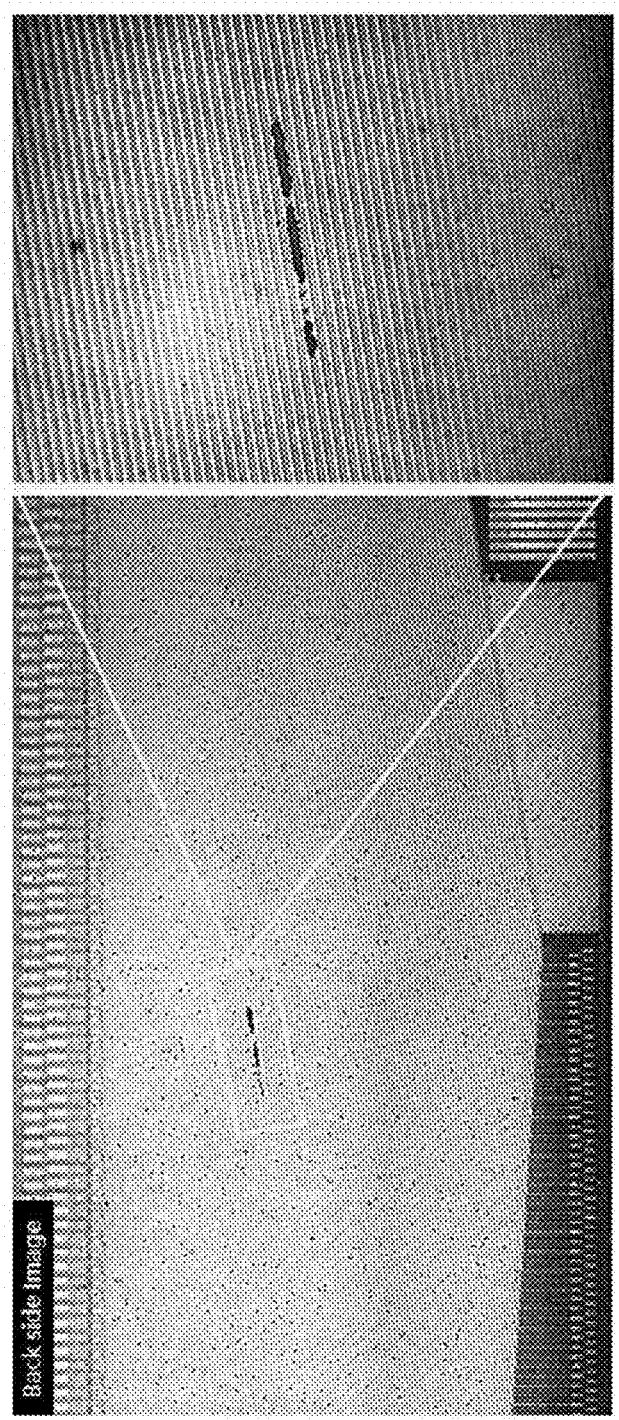
FIG. 17 is a plane image of a display device according to a comparative example.

Hereinafter a defect occurrence of the display device according to a comparative example is described with reference to FIG. 16 and FIG. 17. FIG. 16 is a cross-section image of a display device according to a comparative example, and FIG. 17 is a plane image of a display device according to a comparative example.

Referring to FIG. 16, the fine wiring (marked with an arrow) remaining depending on the process may be provided around the third data voltage supply wiring. At this time, the fine wiring may overlap and be in contact with the common voltage supply wiring and the driving voltage supply wiring in the area where the insulating layer is partially removed. As shown in the image of FIG. 17, when the common voltage supply wiring and the driving voltage supply wiring are shorted due to the fine wiring, it may be confirmed that defects due to heat generation occurred.

However, in the case of the display device in an embodiment, the common voltage supply wiring and the driving voltage supply wiring are prevented from being shorted in the opening area by changing the form of the common voltage supply wiring and/or the driving voltage supply wiring even when there is fine wiring, thereby improving the reliability of the device.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A display device comprising:
 a substrate including a display area and a non-display area;
 a plurality of pixels disposed in the display area;
 a common voltage supply wiring overlapping the non-display area and disposed on the substrate;
 a driving voltage supply wiring overlapping the non-display area and disposed on the substrate; and
 a data voltage supply wiring overlapping the non-display area and electrically connected to the plurality of pixels,
 wherein at least one of the common voltage supply wiring and the driving voltage supply wiring includes a chamfered area,
 the data voltage supply wiring includes a first data voltage supply wiring, a second data voltage supply wiring, and a third data voltage supply wiring, and the first to third data voltage supply wirings are disposed in different layers.

2. The display device of claim 1, wherein
 the data voltage supply wiring extends in a direction different from a main extension direction of the common voltage supply wiring and a main extension direction of the driving voltage supply wiring, and
 the data voltage supply wiring is separated from the chamfered area.

3. The display device of claim 1, wherein
 the chamfered area includes:
 a first straight line extending in a first direction;
 a second straight line extending in a second direction perpendicular to the first direction; and
 a third straight line inclined in a third direction between the first direction and the second direction, and
 an extension direction of the data voltage supply wiring and an extension direction of the third straight line are parallel.

4. The display device of claim 1, further comprising:
 a first conductive layer disposed on the substrate;
 a second conductive layer disposed on the first conductive layer;
 a third conductive layer disposed on the second conductive layer; and
 a fourth conductive layer disposed on the third conductive layer.

5. The display device of claim 4, further comprising:
 a first insulating layer disposed between the second conductive layer and the third conductive layer; and
 a second insulating layer and a third insulating layer disposed on the third conductive layer,
 the third insulating layer includes an opening area overlapping a part of the driving voltage supply wiring and the common voltage supply wiring, and
 the chamfered area overlaps the opening area.

6. The display device of claim 5, wherein
 the first data voltage supply wiring is disposed in a same layer as the first conductive layer, the second data voltage supply wiring is disposed in a same layer as the second conductive layer, and the third data voltage supply wiring is disposed in a same layer as the third conductive layer.

7. The display device of claim 6, wherein
 the driving voltage supply wiring and the common voltage supply wiring are disposed in a same layer as the fourth conductive layer.

8. The display device of claim 7, wherein
 the third data voltage supply wiring overlaps either one of the driving voltage supply wiring and the common voltage supply wiring in the opening area.

9. The display device of claim 7, further comprising:
 a fine wiring extending along an edge of the third data voltage supply wiring.

10. The display device of claim 7, further comprising a metal layer disposed between the driving voltage supply wiring and the common voltage supply wiring,
 wherein the metal layer includes an oblique side facing the chamfered area.

11. The display device of claim 10, wherein
 the metal layer is separated from the driving voltage supply wiring and the common voltage supply wiring.

12. The display device of claim 10, wherein
 the metal layer overlaps the opening area.

13. The display device of claim 10, further comprising:
 at least one of a first metal layer corresponding to the chamfered area of the common voltage supply wiring and a second metal layer corresponding to the chamfered area of the driving voltage supply wiring.

14. The display device of claim 10, wherein
the metal layer overlaps the third data voltage supply wiring.

15. A display device comprising:
a substrate including a display area and a non-display area;
a plurality of pixels disposed in the display area;
a common voltage supply wiring overlapping the non-display area and disposed on the substrate;
a driving voltage supply wiring overlapping the non-display area and disposed on the substrate;
a data voltage supply wiring overlapping the non-display area and electrically connected to the plurality of pixels; and
an insulating layer disposed between the data voltage supply wiring and the driving voltage supply wiring, and between the data voltage supply wiring and the common voltage supply wiring,
wherein the insulating layer includes an opening area exposing at least part of the driving voltage supply wiring and the common voltage supply wiring, and
the data voltage supply wiring in the opening area overlaps and is insulated from the driving voltage supply wiring and the common voltage supply wiring.

16. The display device of claim 15, wherein
the data voltage supply wiring is in plural, and
a plurality of data voltage supply wirings includes a first data voltage supply wiring, a second data voltage supply wiring, and a third data voltage supply wiring disposed in different layers.

17. The display device of claim 15, wherein
at least one of the driving voltage supply wiring and the common voltage supply wiring includes a chamfered area overlapping the opening area.

18. The display device of claim 17, wherein
the data voltage supply wiring extends in a direction different from a main extension direction of the common voltage supply wiring and a main extension direction of the driving voltage supply wiring, and
the chamfered area includes a side parallel to the direction in which the data voltage supply wiring extends.

19. The display device of claim 17, further comprising
a metal layer of an island shape disposed between the driving voltage supply wiring and the common voltage supply wiring.

20. The display device of claim 19, wherein
the metal layer includes an oblique side facing the side of the chamfered area.

* * * * *